United States Patent
Yang et al.

(10) Patent No.: US 9,543,379 B2
(45) Date of Patent: Jan. 10, 2017

(54) SEMICONDUCTOR DEVICE WITH PERIPHERAL BREAKDOWN PROTECTION

(71) Applicants: Hongning Yang, Chandler, AZ (US); Xin Lin, Phoenix, AZ (US); Zhihong Zhang, Chandler, AZ (US); Jiang-Kai Zuo, Chandler, AZ (US)

(72) Inventors: Hongning Yang, Chandler, AZ (US); Xin Lin, Phoenix, AZ (US); Zhihong Zhang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/218,330

(22) Filed: Mar. 18, 2014

(65) Prior Publication Data

US 2015/0270333 A1    Sep. 24, 2015

(51) Int. Cl.
*H01L 29/66* (2006.01)
*H01L 29/06* (2006.01)
*H01L 29/78* (2006.01)
*H01L 29/36* (2006.01)
(Continued)

(52) U.S. Cl.
CPC ..... *H01L 29/063* (2013.01); *H01L 21/823418* (2013.01); *H01L 21/823481* (2013.01); *H01L 27/1203* (2013.01); *H01L 29/0649* (2013.01); *H01L 29/0688* (2013.01); *H01L 29/36* (2013.01); *H01L 29/66681* (2013.01); *H01L 29/7823* (2013.01); *H01L 29/7824* (2013.01)

(58) Field of Classification Search
CPC ............... H01L 29/063; H01L 29/0634; H01L 29/7835; H01L 29/7816; H01L 29/0619; H01L 29/66681; H01L 29/66659; H01L 29/0661

See application file for complete search history.

(56) References Cited

U.S. PATENT DOCUMENTS

| 5,216,275 A | 6/1993 | Chen |
| 5,386,136 A | 1/1995 | Williams et al. |
| 5,438,215 A | 8/1995 | Tihanyi |

(Continued)

OTHER PUBLICATIONS

Merchant et al., "Dependence of Breakdown Voltage on Drift Length and Buried Oxide Thickness in SOI Resurf LDMOS Transistors", Proceedings of the 5th International Symposium on Power Semiconductor Devices and ICs, IEEE, 1993, pp. 124-128, ISBN 0-7803-1313-5.

(Continued)

*Primary Examiner* — Shaun Campbell

(57) ABSTRACT

A device includes a semiconductor substrate, source and drain regions disposed in the semiconductor substrate and having a first conductivity type, a body region disposed in the semiconductor substrate, having a second conductivity type, and in which the source region is disposed, a drift region disposed in the semiconductor substrate, having the first conductivity type, and through which charge carriers drift during operation upon application of a bias voltage between the source and drain regions, a device isolation region disposed in the semiconductor substrate and laterally surrounding the body region and the drift region, and a breakdown protection region disposed between the device isolation region and the body region and having the first conductivity type.

18 Claims, 3 Drawing Sheets

(51) Int. Cl.
*H01L 21/8234* (2006.01)
*H01L 27/12* (2006.01)

(56) References Cited

U.S. PATENT DOCUMENTS

| | | |
|---|---|---|
| 5,923,071 A | 7/1999 | Saito |
| 5,932,897 A | 8/1999 | Kawaguchi et al. |
| 6,137,140 A | 10/2000 | Efland et al. |
| 6,211,552 B1 | 4/2001 | Efland et al. |
| 6,552,390 B2 | 4/2003 | Kameda |
| 6,882,023 B2 | 4/2005 | Khemka et al. |
| 7,282,765 B2 | 10/2007 | Xu et al. |
| 7,466,006 B2 | 12/2008 | Khemka et al. |
| 7,473,978 B2 | 1/2009 | Matsudai et al. |
| 7,535,058 B2 | 5/2009 | Liu et al. |
| 7,569,884 B2 | 8/2009 | Lee |
| 8,039,902 B2 | 10/2011 | Kim et al. |
| 8,159,029 B2 | 4/2012 | Su et al. |
| 8,193,585 B2 | 6/2012 | Grote et al. |
| 8,269,275 B2 | 9/2012 | Chen et al. |
| 8,282,722 B2 | 10/2012 | Vonwiller et al. |
| 8,304,831 B2 | 11/2012 | Zhu et al. |
| 8,330,220 B2 | 12/2012 | Khan et al. |
| 8,350,327 B2 | 1/2013 | Chung et al. |
| 2001/0025961 A1 | 10/2001 | Nakamura et al. |
| 2001/0038125 A1* | 11/2001 | Ohyanagi et al. ............ 257/347 |
| 2002/0017697 A1 | 2/2002 | Kitamura et al. |
| 2006/0267044 A1 | 11/2006 | Yang |
| 2007/0246771 A1 | 10/2007 | McCormack et al. |
| 2007/0278568 A1 | 12/2007 | Williams et al. |
| 2008/0054994 A1 | 3/2008 | Shibib et al. |
| 2008/0067615 A1 | 3/2008 | Kim |
| 2008/0090347 A1 | 4/2008 | Huang et al. |
| 2008/0191277 A1 | 8/2008 | Disney et al. |
| 2008/0246086 A1 | 10/2008 | Korec et al. |
| 2009/0020813 A1 | 1/2009 | Voldman |
| 2009/0224333 A1* | 9/2009 | Lu et al. ............ 257/392 |
| 2011/0127607 A1 | 6/2011 | Cai |
| 2011/0260247 A1 | 10/2011 | Yang et al. |
| 2011/0309442 A1* | 12/2011 | Grote et al. ............ 257/339 |
| 2012/0126323 A1 | 5/2012 | Wu et al. |
| 2012/0126324 A1 | 5/2012 | Takeda et al. |
| 2012/0161233 A1 | 6/2012 | Ito |
| 2012/0205738 A1 | 8/2012 | Yang et al. |
| 2013/0015523 A1 | 1/2013 | You |
| 2013/0292764 A1 | 11/2013 | Yang et al. |

OTHER PUBLICATIONS

Ming Qiao et al., "High-Voltage Thick Layer SOI Technology for PDP Scan Driver IC", Proceedings of the 23rd International Symposium on Power Semiconductor Devices & IC's, May 23-26, 2011, pp. 180-183.
R. Zhu et al., "Engineering RESURF LDMOSFETs for Robust SOA, ESD Protection and Energy Capability", 19th ISPSD, 2007, pp. 185-188.
Vijay Parthasarathy et al., "A Double RESURF LDMOS with Drain Profile Engineering for Improved ESD Robustness", IEEE Electron Device Letter, 2002, pp. 212-214, vol. 23, No. 4.
Lorenz at al., "COOMOS—A New Milestone in High Voltage Power MOS", published at ISPSD, 8 pages, 1999.
Fujihira, T. et al., "Simulated Superior Performances of Semiconductor Superjunction Devices," hoc. of the ISPSD, pp. 423-426, Jun. 1998.
U.S. Appl. No. 13/465,761, filed May 7, 2012 entitled "Semiconductor Device with Drain-End Drift Diminution" Office Action—Restriction on Apr. 29, 2013.
U.S. Appl. No. 13/465,761, filed May 7, 2012 entitled "Semiconductor Device with Drain-End Drift Diminution" Office Action—Non-Final Rejection on Jun. 27, 2013.
U.S. Appl. No. 13/465,761, filed May 7, 2012 entitled "Semiconductor Device with Drain-End Drift Diminution" Office Action—FInal Rejection on Oct. 25, 2013.
U.S. Appl. No. 13/465,761, filed May 7, 2012 entitled "Semiconductor Device with Drain-End Drift Diminution" Office Action—Non-Final Rejection on Jan. 30, 2014.
U.S. Appl. No. 13/465,761, filed May 7, 2012 entitled "Semiconductor Device with Drain-End Drift Diminution" Office Action—Notice of Allowance on Jun. 6, 2014.
U.S. Appl. No. 14/486,104, filed Sep. 15, 2014 entitled "Drain-End Drift Diminution in Semiconductor Devices" Office Action—Notice of Allowance on May 13, 2015.

* cited by examiner

SEMICONDUCTOR DEVICE WITH PERIPHERAL BREAKDOWN PROTECTION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode, and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices are often used in applications, such as automotive applications, involving operational voltages greater than 40 volts. Various features of the LDMOS devices are designed to increase the voltage at which device breakdown (e.g., avalanche breakdown) occurs. For example, breakdown is often prevented through a reduced surface field (RESURF) structure in the LDMOS device design. The RESURF structure is designed to deplete the drift space of the LDMOS device in both vertical and lateral directions, thereby reducing the electric field either near the edge of, or inside, the drift region and thus raising the off-state breakdown voltage (BVdss) of the device. Unfortunately, RESURF structures only address breakdown in areas near or inside the drift region. The breakdown voltage of the device may be established by breakdown that occurs in other locations.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
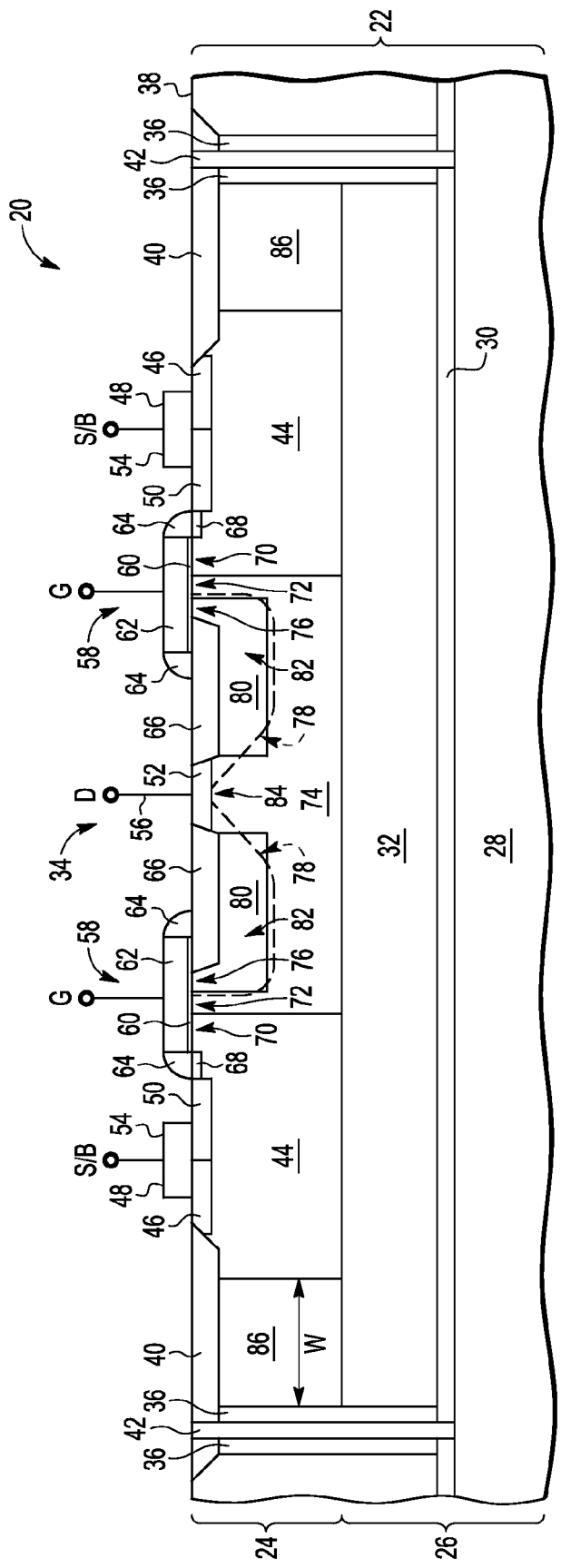
FIG. 1 is a cross-sectional, schematic, partial view of an exemplary LDMOS transistor with internal and peripheral breakdown protection in accordance with one embodiment.

Embodiments of laterally diffused metal oxide semiconductor (LDMOS) and other semiconductor devices and electronic apparatus with breakdown protection are described. The breakdown protection is provided by a breakdown protection region disposed between a device isolation region and a body region or other region of the semiconductor device through which charge carriers pass during operation. The breakdown protection may be provided along a lateral periphery of the device. The breakdown protection region may be configured as a peripheral breakdown protection region or ring.

The breakdown protection may be useful in semiconductor devices having one or more features directed to achieving a high breakdown voltage level. For example, the semiconductor devices may include a semiconductor-on-insulator (SOI) substrate, a RESURF arrangement, and/or a diminished drift region at or near the drain (e.g., an open drain arrangement), as described herein. These and/or other aspects of the semiconductor devices may be used or provided to increase the off-state breakdown voltage (e.g., BVdss) and thereby increase the voltage rating of the semiconductor device.

Power transistors (e.g., LDMOS transistor devices) with a high breakdown voltage level may be useful in power switch regulators for automotive, consumer, and other applications. For example, a field drift LDMOS transistor device with high side capability (e.g., an operational condition in which all source/body and drain terminals are higher than ground) may be useful as a high voltage power switch. In order to prevent breakdown caused by voltage overshooting during switching or electrostatic discharge (ESD) events, a power LDMOS device may be configured to have a breakdown voltage level at least 30-40 Volts higher than the operational voltage, which may be above 100 Volts. The breakdown voltage level (e.g., BVdss) may thus be determinative of the voltage rating of a power transistor.

The breakdown voltage level of a power transistor may be adversely affected by potential pinning at an edge or periphery of the device. The potential may be pinned, or fixed, through charge inversion at or along a wall of a device isolation region, such as a deep trench isolation (DTI) region. For example, the potential pinning and resulting degradation of the breakdown voltage level may occur in p-channel LDMOS transistor devices configured for high voltage operation (e.g., above 100 Volts) with a semiconductor-on-insulator (SOI) substrate. The edge degradation occurs as the source/body voltage near the DTI region is biased higher (e.g., above 100 Volts). Eventually, charge inversion may occur in the n-type body well region disposed at or along the device isolation region walls (e.g., the SOI and/or DTI walls). Once the inversion occurs, the potential at that location is fixed, or pinned. When inversion pinning occurs at either the SOI and/or DTI walls, the pinning potential may be about 15-30 Volts lower than the source/body voltage depending on the thickness (e.g., oxide thickness) of the SOI and DTI walls. For example, with a source/body bias of 110V, the pinning potential may be between about 80-95 Volts, which may be too high for safe device operation and may cause reliability issues. Such high potential pinning at the isolation walls may generate multiple areas under high electric field stress, which may be referred to as hot spots for impact ionization and lead to early avalanche breakdown. One hot spot is located at an upper corner of the DTI region (e.g., at the interface between the DTI and STI regions). Another hot spot is located between the drain region and the insulator layer of the SOI substrate. The inversion and potential pinning may thus lead to breakdown voltage (e.g., BVDSS) degradation in SOI-based p-channel LDMOS transistor devices.

The breakdown protection region of the semiconductor devices may be provided to prevent the potential pinning and resulting breakdown voltage degradation. In some examples, the breakdown protection ring is configured as a lightly doped (e.g., p-type) ring along an interface with an isolation region (e.g., a DTI region) at the substrate surface. For example, the breakdown protection ring may be disposed at the upper corner of a DTI region, an area that would otherwise be a hot spot. The presence of the breakdown protection ring significantly reduces the pinning potential and therefore reduce impact ionization along the device periphery (e.g., at the hot spot at the DTI/STI interface). The reduced pinning potential also significantly lowers the electric field stress elsewhere in the device, such as at other potential hot spots, such as between the drain region and the insulator layer of the SOI substrate.

In some embodiments, the presence of the breakdown protection ring also eliminates a current path that passes through the periphery and bottom areas of the semiconductor devices. The high voltage present at the source/body terminal may cause inversion not only along the lateral periphery of the device area, but also along a lower boundary or bottom of the device area. Without the breakdown protection ring, charge carriers created through impact ionization at the periphery (e.g., at the upper peripheral corner) may be capable of travelling down along the periphery (e.g., along an isolation region). Once the bottom of the device is reached, the charge carriers may then travel laterally along the lower boundary at or near an interface with a doped buried layer. Charge carriers that reach the interior of the semiconductor device may then not have much separation from the drain terminal. For example, the charge carriers may reach the drain terminal by punching through a portion of an epitaxial layer between a drift region and the bottom of the device. Without the protection ring, punchthrough may occur when the pinning potential reaches the punch-through voltage (e.g., often less than about 50 Volts). As a result, the device may exhibit unacceptably high levels of leakage current. The breakdown protection ring may interrupt such communication along the periphery of the device, thereby reducing or eliminating the leakage current in addition to delaying breakdown.

Although described below in connection with p-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. The disclosed devices may have varying RESURF structures, including single, double, or other RESURF structural arrangements, each of which may be referred to herein as a "RESURF transistor."

For convenience of description and without any intended limitation, p-channel LDMOS devices are described and illustrated herein. Thus, n-type peripheral breakdown protection regions are described. However, the breakdown protection regions of the disclosed devices may be useful in other device configurations in which inversion occurs. In such cases, the semiconductor regions, layer or other structures in the examples described below may thus have a conductivity type (e.g., n-type or p-type) opposite to the type identified in the examples below.

Although described in connection with power switch regulators, the semiconductor devices described herein are not limited to any particular type of integrated circuit, discrete device, or other electronic apparatus. The semiconductor devices may be useful in connection with a wide variety of applications.

FIG. 1 is a schematic cross-sectional view of an example of a p-channel LDMOS device 20 constructed and isolated in accordance with one embodiment. In this example, isolation is provided via a combination of DTI regions and SOI structures. The device 20 may be configured as a RESURF transistor. The device 20 includes a semiconductor substrate 22, which may, in turn, include a number of epitaxial layers 24. In this example, the semiconductor substrate 22 includes a single p-type epitaxial layer 24 grown on an original substrate 26. The original substrate 26 may be a lightly doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon.

The device 20 is isolated from other devices formed in the semiconductor substrate 22 along a bottom or lower boundary by one or more layers or regions. In the embodiment of FIG. 1, the semiconductor substrate 22 has a silicon-on-insulator (SOI) construction. The original substrate 26 includes a support substrate 28, a buried insulator layer 30 on or over the support substrate 28, and one or more semiconductor layers 32 on or over the buried insulator layer 30. The buried insulator layer 30 may include silicon oxide. For example, the buried insulator layer 30 may include a silicon dioxide layer having an exemplary thickness falling in a range from about 0.1 microns to about 10 microns. In other examples, the thickness may fall in a range from about 0.2 microns to about 1.5 microns. In this example, the semiconductor layer 32 is configured as a doped buried layer 32. The semiconductor layer 32 may be doped before the growth of the epitaxial layer 24. The buried insulator layer 30 and the doped buried layer 32 provide device isolation along the bottom or lower boundary of the device 20.

The structural, material, and other characteristics of the semiconductor substrate 22 may vary from the example shown. For example, additional, fewer, or alternative layers may be included in the semiconductor substrate 22. For example, any number of additional semiconductor and/or non-semiconductor layers may be included. The disclosed devices are thus not limited to, for instance, SOI substrates or substrates including epitaxially grown layers, and instead may be supported by a wide variety of other types of semiconductor substrates, including bulk substrates.

A device region 34 of the device 20 is depicted in FIG. 1. In this embodiment, the device region 34 is configured to allow the semiconductor device 20 to be laterally symmetrical about a drain terminal described below. Alternatively, FIG. 1 may depict multiple semiconductor devices that share a common drain. For example, FIG. 1 may depict a pair of symmetrical semiconductor devices. In other cases, the device 20 has other symmetry or is not laterally symmetrical. For example, in other embodiments, the overall device region may correspond with half of the device region 34 depicted in FIG. 1.

The device area 34 may be defined by one or more device isolation layers or regions in the semiconductor substrate 22 (e.g., the epitaxial layer 24). The device isolation layer(s) or region(s) may laterally and/or otherwise surround the device area 34. These layers or regions act as a barrier that electrically isolates or separates the device area 34 from the rest of the substrate 22. In the embodiment of FIG. 1, the lateral boundary(ies) of the device area 34 are defined by trench regions 36 (e.g., DTI regions). The DTI regions 36 may be ring-shaped to laterally surround the device area 34. Each DTI region 36 extends downward from a surface 38 of the semiconductor substrate 22 (or an isolated point near the surface 38) to reach the buried insulator layer 30 (or other buried device isolation layer). In this example, device isolation is provided by a pair of DTI regions 36 that extend from a shallow trench isolation (STI) region 40 at the surface 38. The STI region 40 may be ring-shaped and disposed along the lateral periphery of the device area 34. The STI region 40 may define an active area of the semiconductor device 20.

In the embodiment of FIG. 1, the DTI regions 36 are separated by a substrate tie 42. The substrate tie 42 may be configured as an inner conductive trench, such as a doped polysilicon plug, disposed between the DTI regions 36. The substrate tie 42 may extend downward from the surface 38, through the STI region 40 and the buried insulating layer 30, to reach the support substrate 28. A contact at the surface 38 may be provided to ground or otherwise bias the support substrate 38 via the substrate tie 42. The configuration of the trench regions along the lateral periphery of the device area 34 may differ from the example shown in FIG. 1. For example, the trench region(s) may not a substrate tie.

A lower or bottom boundary of the device area 34 is defined by one or more device isolation layers disposed in the semiconductor substrate 22. In the embodiment of FIG. 1, the lower boundary is defined by the doped buried layer 32 and the buried insulating layer 30. In this example, the doped buried layer 32 and the buried insulating layer 30 extend laterally across (e.g., under) the entire extent of the device area 34. In p-channel embodiments, the doped buried layer 32 is a buried n-type layer. The dopant concentration level of the doped buried layer 32 may be selected such that the doped buried layer 32 is depleted (e.g., fully depleted) during operation. The doped buried layer 32 may be formed in the semiconductor substrate 22 before the growth of the epitaxial layer 24. In some cases, the doped buried layer 32 may assist in drift region depletion to support the RESURF effect described below.

The doped buried layer 32 may constitute one of multiple doped device isolating regions (not shown) surrounding the device area 34. For example, a moderately or heavily doped isolation well (not shown) may laterally surround the device area 28. For example, the isolation well may have a dopant concentration level of about $5 \times 10^{16}/cm^3$ to $5 \times 10^{17}/cm^3$ or more. The isolation well may be ring-shaped. The isolation well may be disposed on or otherwise above the buried n-type layer and outside of, or along, the lateral periphery of the device area 34. Additional, fewer, or alternative device isolation layers or regions may be provided in the semiconductor substrate 22.

The device 20 includes a device body or body region 44 in the semiconductor substrate 22. In this example, the body region 44 is an n-type well formed in the epitaxial layer 24 of the substrate 22. The n-type well may be configured for high voltage operation (e.g., high side operation). The body region 44 may be biased via one or more heavily doped n-type body contact regions 46 and corresponding electrodes or terminals 48 formed in or otherwise above the n-type well of the body region 44 in the semiconductor substrate 22. The dopant concentration of each contact region 46 may be at a level sufficient to establish an ohmic contact to the body region 44. In this example, the body region 44 is a ring-shaped well. The dimensions and shape of the ring may vary, and other shapes may be used.

The device 20 includes heavily doped source and drain regions 50 and 52 in the semiconductor substrate 22. The source and drain regions 50 and 52 are laterally spaced from one another in the lateral dimension shown in the cross-section of FIG. 1. In some embodiments, the source and drain regions 50 and 52 may have additional or alternative lateral spacing. In this example, the semiconductor device 20 includes a single, central drain region 52 surrounded by a single ring-shaped source region 50. In other cases, any number of source or drain regions 50, 52 may be provided. Other source/drain arrangements may be used. For example, the drain region 52 may not be centered or otherwise disposed between, or laterally surrounded by, the source region 50 as shown. In this example, the source and drain regions 34 and 36 are p-type doped portions of the epitaxial layer 24. The heavily doped p-type source region 50 is disposed within, on, and/or otherwise above the body region 44. The heavily p-type doped drain region 52 is spaced from the body region 44 along the lateral dimension shown in FIG. 1. Such spacing defines a conduction path of the device 20 between the source and drain regions 50 and 52. The conduction path may thus be oriented along the lateral dimension shown in FIG. 1. The source and drain regions 50, 52, or a portion thereof, may have a dopant concentration at a level sufficient to establish ohmic contacts with source and drain electrodes or terminals 54, 56 for biasing the source and drain regions 50, 52, respectively. In a typical p-channel LDMOS configuration, the drain region 52 is biased at a relatively low voltage relative to the source/body bias voltage. The bias voltage may be negative. In some cases, the drain-source voltage, Vds, in a high-side automotive switch application may fall in a range from about 0 to about −140 Volts, with the drain terminal 56 in a range from about 90 to about −50 Volts and the source terminal 54 at about +90 Volts.

The device 20 includes one or more gate structures 58 formed on or above the surface 38 of the semiconductor substrate 22. The gate structure 58 is disposed between the source region 50 and the drain region 52. In some embodiments, the gate structure 58 surrounds the drain region 52. Alternatively, the gate structure 58 may be arranged in a multiple (e.g., dual) gate finger configuration in which multiple transistors are symmetrically arranged to share a common drain region 52. The gate structure 58 includes a gate dielectric 60, a conductive layer 62 on or over the gate dielectric 60, and sidewall spacers 64 along sidewalls of the gate dielectric 60 and the conductive layer 62. The gate dielectric 60 may include silicon dioxide (or oxide) deposited or otherwise formed on the surface 38. The conductive layer 62 may include a polysilicon plate. The gate dielectric 60 insulates the conductive layer 62 from the substrate 22. The sidewall spacers 64 may include a dielectric material disposed along lateral edges of the gate structure 58. The sidewall spacers 64 may cover the lateral edges to act as a silicide blocker to prevent a silicide short along the surface 38. The sidewall spacers 64 may provide spacing to separate the conductive components of the gate structure 58 from the source region 50 and other regions of the device 20. In this example, one of the sidewall spacers 64 is used for alignment purposes in defining an edge of the source region 50.

The configuration of the gate structure 58 may vary. For example, the gate structure 38 may include multiple conductive layers (e.g., polysilicon plates). The components, materials, and other characteristics of the gate structure 58 may thus vary from the example shown.

A number of STI regions 66 may be formed at the surface 38 in the semiconductor substrate 22. In this embodiment, a ring-shaped STI region 66 spaces the gate structure 58 from the high voltage applied to the drain region 52. These and other ones of the STI regions 66 may be configured to prevent or minimize hot carrier injection (HCI) into the gate dielectric 60 of the gate structure 58. With the STI region 66, the semiconductor device 20 may be configured as a field drift LDMOS transistor device. The field oxide (or other dielectric) may be provided via other structures in other embodiments. Alternatively, the semiconductor device 20 is configured as an active drift device.

Additional STI regions may be disposed in the semiconductor substrate 22 to isolate or separate various contact regions, such as the body contact region 46 and the source region 50, as well as other regions for biasing components of the device 20. For example, an isolation contact region and a substrate contact region may be separated by one or more STI regions.

The device 20 may be configured with one or more lightly or intermediately doped transition or extension regions (e.g., n-type lightly doped drain, or NLDD, regions) at or near the source and drain regions 50 and 52. Each transition region may be or include a diffused region formed in connection with the source region 50 and/or the drain region 52. Such transition regions may assist in controlling the electric field at or near the surface 38, including in areas other than those areas near the source region 50 or the drain region 52. In this example, the device 20 includes a PLDD region 68 adjacent the source region 50. The PLDD region 68 may extend laterally under the gate structure 58 as shown.

When the gate structure 58 is biased, charge carriers (in this case, holes; alternatively, electrons) accumulate in one or more channel areas or regions 70. Each channel region 70 (or a portion thereof) may be located in the body region 44 under the gate structure 58. In this example, the accumulation of holes results in a charge inversion in the channel region 70 from the n-type body region 44 to a p-type conduction layer or area near the surface 38 of the semiconductor substrate 22. Once a sufficient amount of the charge carriers accumulate in the conduction layer or area, charge carriers are capable of flowing from the source region 50 toward the drain region 52 through the channel region 70.

The channel region 70 may include other regions or areas in the semiconductor substrate 22 in which charge inversion or accumulation occurs as a result of the bias applied to the gate structure 58. Charge carriers may also accumulate outside of or beyond the body region 44. In the example of FIG. 1, charge carriers may also accumulate in a portion 72 of a central region 74 of the epitaxial layer 24 adjacent the body region 44. The portion 72 may, in some cases, be considered to be part of an accumulation region 76 of the device 20. The accumulation region 76 is a portion of a drift region 78 of the device 20 disposed under the gate structure 58 at or near the surface 38. Charge carriers accumulate in the accumulation region 76 upon application of the gate bias voltage. The channel region 70 and the accumulation region 76 may form part of a conduction region or path of the device 20.

The conduction path of the device 20 is not limited to regions in which charge inversion or accumulation occurs or to regions in which conduction is enabled or enhanced via the bias voltage applied to the gate structure 58. The conduction path or regions of the device 20 are thus not limited to regions at or near the surface 38. For example, the conduction path includes other portions of the drift region 78 through which charge carriers drift to reach the drain region 52. The drift region 78 may electrically couple the drain region 52 and the channel region 70. In this example, the drift region 78 is formed with, and/or includes, a p-type well 80 under the STI region 66. As described below, the drift region 78 may be defined through a dopant implantation to form the p-type well 80 and a subsequent thermal anneal (or other fabrication process) during which heating leads to dopant diffusion that distributes the dopant under the drain region 52.

The drift region 78 (and the p-type well 80) may laterally extend under the gate structure 58 to form the accumulation region 76 of the device 20. The p-type well 80 and/or the drift region 78 may be adjacent to (e.g., line-on-line or contiguous with), and/or spaced from, the body region 44. During operation, charge carriers accumulate in the accumulation region 76 before drifting through the drift region 78. The conduction path of the device 20 may include additional or alternative areas or regions having a different conductivity type than the body region 44.

In the embodiment of FIG. 1, the drift region 78 is configured as a field drift region or (RESURF region). The STI region 66 is disposed between the accumulation region 72 and the drain region 52. Alternative or additional field isolation structures may be disposed between the accumulation region 76 and the drain region 52. For example, the field isolation structures may include one or more field plates disposed above the surface 38.

The conduction path or regions of the device 20 may include still other regions, whether n-type or p-type, at or near the surface 38. For example, the channel region 70 and/or other conduction region of the device 20 may include one or more intermediately doped p-type transition regions in addition to the PLDD region 68.

The path along which the charge carriers flow from the source region 50 to the drain region 52 passes through the drift region 78 in the semiconductor substrate 22. The drift region 78 may be configured to allow the charge carriers to drift under the electric field established by the drain-source voltage applied between the drain region 52 and the source region 50. The drift region 78 (or one or more portions thereof) thus forms part of the conduction path of the device 20. During operation, the drift region 78 electrically couples the drain region 52 to the channel region 48 and the source region 50.

The drift region 78 may be configured for depletion during operation to reduce the magnitude of the electric field in accordance with the reduced surface field (RESURF) effect. The depletion of the drift region 78 may lead to improved breakdown performance. In this example, one or more PN junctions form between the p-type regions (e.g., p-type well 80 and the region 74 of the p-type epitaxial layer 24) and the n-type regions (e.g., the body region 44 and the buried layer 32) to establish a RESURF effect directed to decreasing the electric field in areas in and/or around the drift region 78. A decreased electric field may avoid breakdown along the conduction path, and thereby increase the intrinsic breakdown voltage (BVdss) of the device 20. The drift region 78 may be further configured to achieve both a high breakdown voltage level and a low drain-source resistance (Rdson) by leveling the electric field in certain locations within the drift region 78. The drift region 78 may be depleted both laterally and vertically, at least in part, during operation along reverse-biased PN junctions with, for instance, the buried layer 32 and/or the body region 44. The junctions are reverse biased as a result of the application of the drain voltage Vds between the source region 50 and the drain region 52. The reverse-biased junctions may reduce the electric field, as in the RESURF effect, for improved breakdown performance. In an alternative embodiment, the device 20 may be configured to establish a double RESURF effect, in which, for example, one or more additional regions may be disposed adjacent (e.g., below or under) the drift region 78 for further depletion in the device area 34. Further details regarding the structural and operational characteristics of suitable RESURF regions are set forth in U.S. Pat. No. 6,882,023 ("Floating RESURF LDMOSFET and Method of Manufacturing Same").

The drift region 78 may be configured in an open-drain or other configuration in which the drift region 78 is diminished at or under the drain region 52. A diminished drift region may be useful in providing for full (or near full) depletion of the drift region 78 during operation. Such full depletion may, in turn, avoid the weakening of the RESURF effect that may otherwise occur in embodiments having long drift lengths (e.g., greater than about 5 microns) in the interest of increasing the breakdown voltage. Further details regarding the configuration of the drift region 78 are described below.

In the embodiment of FIG. 1, the drift region 78 includes a field drift portion or section 82 under the STI region 66. The field drift section 82 may have a lateral length of approximately 5 microns or more. The field drift section 82 extends from a channel or accumulation side (or end) to a drain side (or end) of the drift region 78. During operation, charge carriers drift from the channel side to the drain side through the field drift section 82 under the electric field arising from the drain-source bias voltage. In this example, the charge carriers reach the channel side after exiting the channel region 70 and/or the accumulation region 76. The charge carriers then drift around the STI region 66 through the field drift section 82 to reach the drain side.

The drift region 78 may be configured to present one or more dopant concentration levels in the field drift section 82 and at the channel and drain sides to establish a suitable on-resistance (e.g., Rdson) value. The dopant concentration level may vary over the depth of the field drift section 82 and/or at the channel side and/or the drain side. For example, the dopant concentration level in the field drift section 82 (and/or at the channel side and/or the drain side) may be higher near the STI region 66 than near the PN junction with the region 74 of the epitaxial layer 24. Alternatively or additionally, the dopant concentration level in the field drift section 82 may vary as a function of lateral position. For example, the dopant concentration level at a given depth at the drain side may decrease as the lateral distance to the drain region 52 decreases. The dopant concentration level in the drift region 78 at a given depth may further decrease with increasing overlap with the drain region 52. In the example of FIG. 1, the dopant concentration level decreases to an extent that an opening 84 in the drift region 78 under the drain region 52 remains after the annealing of the p-type well region 80. The dopant concentration level in the field drift section 82 at or along the drain side may vary in another lateral dimension (e.g., the lateral dimension orthogonal to the one shown in FIG. 1).

As shown in FIG. 1, the p-type well region 80 may have a cutoff inner boundary or edge. A thermal anneal or other fabrication step(s) distributes the p-type dopant of the well region 80 to form a connection between the drift region 78 and the drain region 52. In the embodiment shown in FIG. 1, the p-type well region 80 does not laterally overlap with the drain region 52 prior to the anneal or other fabrication step(s). The cutoff of the p-type well 80 may thus be laterally spaced from the drain region 52. In this example, the p-type well 80 is configured such that the inner edge or boundary has an upright or vertical wall. A thermal anneal after the implant that forms the p-type well 80 may smoothen the sharp edge(s) of the wall as shown in FIG. 1. The cutoff in this example is positioned under the STI region 66. In other embodiments, the cutoff is positioned under the drain region 52 such that the p-type well 80 does not laterally extend across the drain region 36 before the thermal anneal.

A connection between the drain and drift regions 52, 78 is formed through diffusion of dopant from one or both of the p-type well 80 and the drain region 52. The diffusion may occur during the thermal anneal or other fabrication step(s). The diffusion results in the spreading of dopant into a space between the p-type well 80 and the drain region 52. The spreading may include lateral spreading in the lateral dimension shown in FIG. 1. The diffusion may also include a vertical component. For example, dopant from the drain region 52 may diffuse downward (as well as laterally outward) into the semiconductor substrate 22. Alternatively or additionally, dopant from the p-type well 80 may diffuse upward (as well as laterally inward). Eventually, the diffusion establishes one or more current passes or paths in the space between the p-type well 80 and the drain region 52. The current paths may be positioned along the STI region 66. The current paths may provide a low resistance path through which the charge carriers drift during operation under the applied bias voltage. Any adverse effects on the on-resistance of the device 20 arising from the cut-off or edge may thus be avoided.

The cutoff or edge at the drain side of the well 80 is positioned such that the drift region 78 is diminished under the drain region 52. For example, the drift region 78 may have a lateral profile that varies across the drain region 52 in the lateral dimension shown in FIG. 1. Such diminution of the drift region 78 may allow the drift region 78 to be fully depleted under or along the drain region 52 during operation despite the distance from the PN junction between the n-type well 80 and the body region 44 (and/or the p-type epitaxial layer 24). Such diminution may be useful in devices having long drift lengths. The drift region 78 may be further diminished at, along, or near the drain region 52 in the other lateral dimension. For example, the drift region 78 may have a notched dopant profile in the other lateral dimensions.

While the diffusion may establish the electrical connection of the drift region 78 and the drain region 52, but the diffusion may not, as in this example, lead to the drift region 78 extending fully across the entire lateral extent of the drain region 52 in the lateral dimension shown. The drift region 78 includes the opening 84 under the drain region 52. In this example, the opening 84 is positioned between current passes or paths of the drift region 78 formed by the diffusion. The current paths electrically link the drain region 78 to the field drift section 82 of the drift region 78 and the remainder of the conduction path of the device 20.

The opening 84 in the drift region 78 diminishes the drift region 78 at or near the drain region 52 to increase the extent to which the drift region 78 is depleted under or near the drain region 52 during operation. In some cases, the diminishment of the drift region 78 leads to the full depletion of the drift region 78 under or near the drain region 52 during operation. The RESURF effect may thus be enhanced despite conditions (e.g., a long field drift region) that may otherwise limit the RESURF effect. The spreading of the dopant to establish the connection between the drain region 52 and the drift region 78 may also lead to such diminution. Moreover, with the current paths, the charge carriers may reach the drain region 52 without encountering an area of low dopant concentration or high resistivity. The enhancement of the RESURF effect may thus be provided while maintaining one or more low-resistance path(s) for the charge carriers.

In this example, each current path extends along the STI region 66 from a respective one of the drain sides of the field drift section 82 only partially across the drain region 52 as shown. As the current paths extend inward to reach the drain region 52, the depth of a lower boundary of the drift region 78 decreases. Diffusion from the drain region 52 may contribute to the formation of the current paths, but the current paths may be considered an inner section of the drift region 78 surrounded by an outer section of the drift region (e.g., the field drift section 82). The inner section of the drift region may be shallower, thinner, less doped, and/or otherwise diminished relative to the outer section. Full or increased depletion of the drift region may thus be attained.

Due to the diffusion, the drain side of the drift region 78, including, e.g., the current paths, may have sloped boundaries, such as the lower boundary, rather than an upright wall. The drift region 78 may also narrow (in vertical thickness) at the drain side as a result of the cutoff and the diffusion. For example, the vertical thickness of the current paths may be lower than the vertical thickness of the field drift section 82 of the drift region 52. The shape of the current paths may vary. The current paths may have a dopant concentration level configured for a suitable or acceptable on-resistance. The dopant concentration level may decrease as the spacing or distance from the STI region 66 increases.

One or more parameters or characteristics of the device 20 may be configured to ensure that the opening 84 remains between the current paths despite the diffusion. Examples include the lateral position of the edge 62 (FIG. 1), the dose and energy of the implant that forms the drain region 36, and the depth of the STI region 66.

By cutting off the lateral extent of the drift region 78 under the drain region 52, the device 20 may avoid operational conditions in which some (e.g., an inner portion) of the drift region 78 is not fully depleted, which may reduce the RESURF effect. The cutoff may thus remove the portion of a conventional drift region in which depletion is less likely to occur due to the length of the field drift section 82.

The shape, dopant concentration level, and other characteristics of the current paths (and, thus, the drift region 78) may vary from the example shown. For example, the lateral width of the current paths (and, thus, the drift region 78) in the lateral dimension shown may vary. The dopant concentration level of the current paths may alternatively or additionally vary. The extent to which the drift region 78 extends across the lateral width of the drain region 52 may vary accordingly. These characteristics may be adjusted or configured by changing the lateral position of the cutoff.

In some alternative embodiments, the drift region 78 is still diminished under the drain region 52, but without the opening 84. For example, the drift region 78 may narrow (in vertical thickness) at the drain region 52 to define the current paths. In such cases, a portion of the current paths (or other dopant diffusing from the p-type well 80 (FIG. 1) or the drain region 52) may extend across the drain region 52. The dopant concentration level in such areas under the drain region 52 may be lower than the level along the STI region 66 through which the charge carriers drift to reach the drain region 52. The concentration level may thus decrease at a given depth as the distance from the STI region 66 increases (e.g., until the center of the device 20 is reached). The concentration level under the drain region 52 may additionally or alternatively decrease with increasing depth. The diminution of the drift region 78 under the drain region 52 may accordingly include a lowered dopant concentration level relative to the levels reached in the field drift section 82 of the drift region 78.

The dopant concentration levels, profiles, and other characteristics of the drift region 78 (with or without an opening under the drain region 52) may vary as described in U.S. Patent Publication No. 2013/0292764 ("Semiconductor Device with Drain-End Drift Diminution") and co-pending and commonly assigned U.S. patent application Ser. No. 13/748,076, filed Jan. 23, 2013, and entitled "Semiconductor Device with Enhanced RESURF."

One or more of the above-described features of the semiconductor device 20 are directed to prevent, delay, or protect against breakdown within an interior of the device 20, such as at or near the drain region 52. For instance, the features may be directed to preventing breakdown along the conduction path of the device 20. In contrast, the features may not provide such breakdown protection along the periphery of the device area 34. However, the overall breakdown voltage level and, thus, the voltage rating, of the device 20 may not increase without such peripheral protection.

To support higher breakdown voltage levels in accordance with one aspect of the disclosure, the semiconductor device 20 includes a breakdown protection region 86. The breakdown protection region 86 may provide protection along the periphery or edge of the device area 34, and/or portions of the device area 34 spaced from the conduction path of the semiconductor device 20. The breakdown protection region 86 may be disposed along the lateral periphery of the device area 34. The breakdown protection region 86 is disposed between the DTI region 36 and the body region 44. In this example, the breakdown protection region 86 is disposed along, and contiguous with, an inner wall or boundary of the DTI region 36. On the other side, the breakdown protection region 86 is disposed along, and contiguous with, an outer boundary of the body region 44. In other cases, the breakdown protection region 86 may not abut the DTI region 36 or the body region 44. The breakdown protection region 86 has the opposite conductivity type of the body region 44. In this example, the breakdown protection region 86 is a p-type well.

In the embodiment of FIG. 1, the breakdown protection region 86 includes or is configured as a ring-shaped well. The breakdown protection region 86 may laterally surround the body region 44. Other dopant concentration profiles may be used.

The breakdown protection region 86 may be electrically floating. In the embodiment of FIG. 1, the breakdown protection region 86 is disposed under or below the STI region 40. The breakdown protection region 86 may be spaced from the surface 38 via additional or alternative regions or layers. The breakdown protection region 86 may have a lower boundary contiguous with the doped buried layer 32. The depth of the lower boundary of the breakdown protection region 86 may vary.

The breakdown protection region 86 may be a lightly doped region disposed in, or of, the epitaxial layer 24 of the substrate 22. The breakdown protection region 86 may have a dopant concentration level lower than the dopant concentration level (e.g., about $1 \times 10^{17}/cm^3$) of an isolation tub ring or region. In some cases, the breakdown protection region 86 may correspond with a portion of the epitaxial layer 24 not modified or doped by the doping procedures used to form the other device regions. For example, the breakdown protection region 86 is a portion of the epitaxial layer 24 outside of the dopant profiles of the body region 44 and the drift region 78. In these and other cases, the breakdown protection region 86 may have a dopant concentration level below the dopant concentration level of the body region 44, e.g., a dopant concentration level of about $1 \times 10^{13}/cm^3$- to about $1.5 \times 10^{15}/cm^3$.

Alternatively, the breakdown protection region 86 is formed by a dopant implantation procedure. For example, an implantation procedure may be used to establish a higher dopant concentration level than the level provided by the epitaxial layer 24. An existing implantation procedure directed to forming other regions of a power transistor device, logic transistor device, or other semiconductor device in the substrate 22 may be used. For example, a compensation implantation procedure directed to compensating for (e.g., slightly exceeding) the dopant concentration level of an epitaxial layer (e.g., n-type epitaxial layer) or other lightly doped region may be used. The compensation or other implantation procedure may be useful in embodiments having an n-type support substrate 28 and an n-type epitaxial layer 24. In other cases, the breakdown protection region 86 may be doped to a level that compensates for, or overcomes, the dopant concentration level of the body region 44.

In operation, the breakdown protection region 86 prevents inversion from occurring at the lateral periphery of the device area 34. Without such inversion, electric field stress is thus reduced along the DTI region 36, e.g., at or near the corner formed by the DTI region 36 at the surface 38 of the substrate 22. The lower electric field prevents impact ionization along the periphery. As a result, no current is generated along the periphery of the device area 34, and the leakage current path is disrupted. As a further result, the voltage at the bottom of the device area 34 is closer to the voltage at the drain region 52. The electric field stress is thus also reduced at or near the drain region 52. For all of these reasons, the breakdown voltage level and voltage rating of the semiconductor device 20 may be improved as a result of the breakdown protection region 86. In one example, the breakdown voltage level increased from about 107 Volts, with breakdown occurring along the device area periphery, to about 146 Volts, with breakdown eventually occurring near the drain region 52.

A width W of the breakdown protection region 86 may be selected to optimize or maximize the improvement in the breakdown voltage level (e.g., BVdss) of the semiconductor device 20. The width W is defined as shown in FIG. 1 as the lateral direction that corresponds with a spacing between the body region 44 and the DTI region 36. In embodiments having a ring-shaped breakdown protection region 86, the width W may be uniform around the entire circumference or perimeter of the device area 34. In some embodiments, the improvement in breakdown voltage level peaks at a certain width W. For example, the width W falls in a range from about 1.0 microns to about 2.0 microns. For example, the width W may be about 1.5 microns. The breakdown voltage level may thus eventually decrease with further increases in the width W, e.g., beyond 2.0 microns. If the breakdown protection region 86 is too wide, instability and/or other conditions may be present that lead to breakdown at a lower level. The instability may arise from layout issues presented in the other lateral dimension not shown in FIG. 1. Other widths may be used. For example, other widths (and width ranges) may be appropriate given different dopant concentration levels of the body region 44 and/or other device regions.

Figure 2:
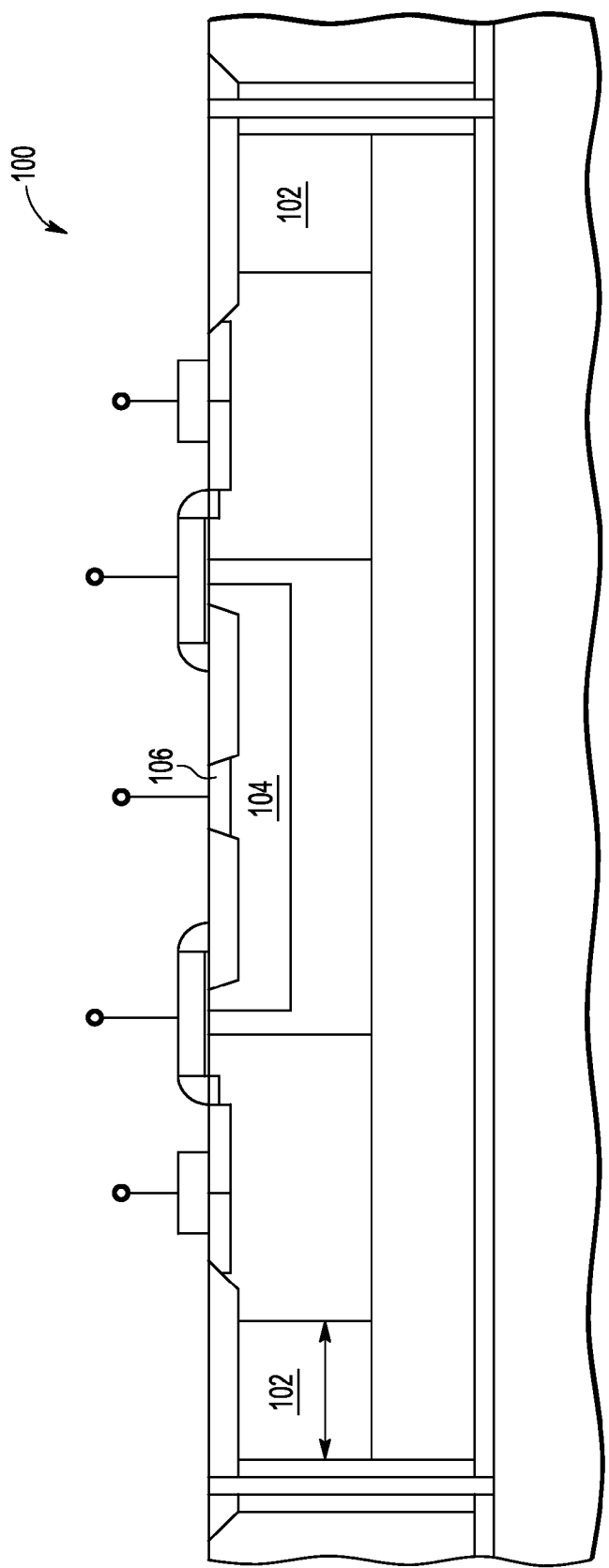
FIG. 2 is a cross-sectional, schematic, partial view of an exemplary LDMOS transistor with peripheral breakdown protection in accordance with one embodiment.

FIG. 2 depicts a semiconductor device 100 with peripheral breakdown protection as described above. The peripheral breakdown protection is provided by a breakdown protection region 102, which may be configured as described above. For example, the breakdown protection region 102 may be ring-shaped with a lateral width W that falls within the above-described range.

The embodiment of FIG. 2 does not have an open drain configuration or other cutoff or diminished drift region, as described above. In the embodiment of FIG. 2, the semiconductor device includes a drift region 104 that extends across an entire lateral extent of a drain region 106. Instead of being cutoff or diminished at the drain region 106, the drift region 104 may have a uniform dopant concentration profile across the entire lateral extent of the drain region 106.

The semiconductor device 100 may be otherwise configured similarly to the embodiments described above in connection with FIG. 1.

The above-described devices are shown in simplified form. For example, FIGS. 1 and 2 do not show the conductive (e.g., ohmic) contacts and other metal layers configured for electric coupling with the source region 50, the drain region 52, and the gate structure 58. The devices may have a number of other structures or components for connectivity, isolation, passivation, and other purposes not shown in FIGS. 1 and 2 for ease in illustration. For instance, the devices may include any number of additional isolating regions or layers. In some examples, another p-type epitaxial layer (not shown) may be disposed between the original substrate and the device area. One or more further STI regions, other isolation trenches, and/or isolation wells (not shown) may be provided to isolate the device area and/or other region of the device.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
|---|---|---|
| p-epi 24: | $1 \times 10^{13}$-$2 \times 10^{15}$/cm$^3$ | 1-10 μm |
| substrate 28: | $1 \times 10^{15}$-$1 \times 10^{18}$/cm$^3$ | not applicable |
| buried layer 32: | $3 \times 10^{15}$-$5 \times 10^{16}$/cm$^3$ | 1-2.5 μm |
| body 44: | $1 \times 10^{16}$-$1 \times 10^{18}$/cm$^3$ | 0.5-1.5 μm |
| contact 46: | $1 \times 10^{21}$-$5 \times 10^{21}$/cm$^3$ | 0.15-0.25 μm |
| source 50: | $1 \times 10^{21}$-$5 \times 10^{21}$/cm$^3$ | 0.15-0.25 μm |
| drain 52: | $1 \times 10^{21}$-$5 \times 10^{21}$/cm$^3$ | 0.15-0.25 μm |
| PLDD 68: | $1 \times 10^{18}$-$1 \times 10^{19}$/cm$^3$ | 0.2-0.3 μm |
| p-well 80: | $3 \times 10^{15}$-$1 \times 10^{17}$/cm$^3$ | 0.5-2 μm |
| p-well 86: | $1 \times 10^{14}$-$3 \times 10^{16}$/cm$^3$ | 1-2 μm |

The concentrations and thicknesses may be different in other embodiments. For example, the dopant concentration of the original substrate 26 may vary considerably.

FIGS. 1 and 2 depict the semiconductor devices 20, 100 in simplified form in the sense that only one lateral dimension of the devices 20, 100 is shown. For example, the gate structure 58 may be U-shaped or arch-shaped (e.g., a single lateral connection) or toroidal or looped (e.g., two lateral connections) when viewed from above. The shapes of the above-described regions of the devices 20, 100 may vary considerably from these examples. In some embodiments, the devices 20, 100 are not symmetrical about a common drain region. For example, the drain region 52 may thus not be disposed in the center (or along a central line) of the device 20.

Figure 3:
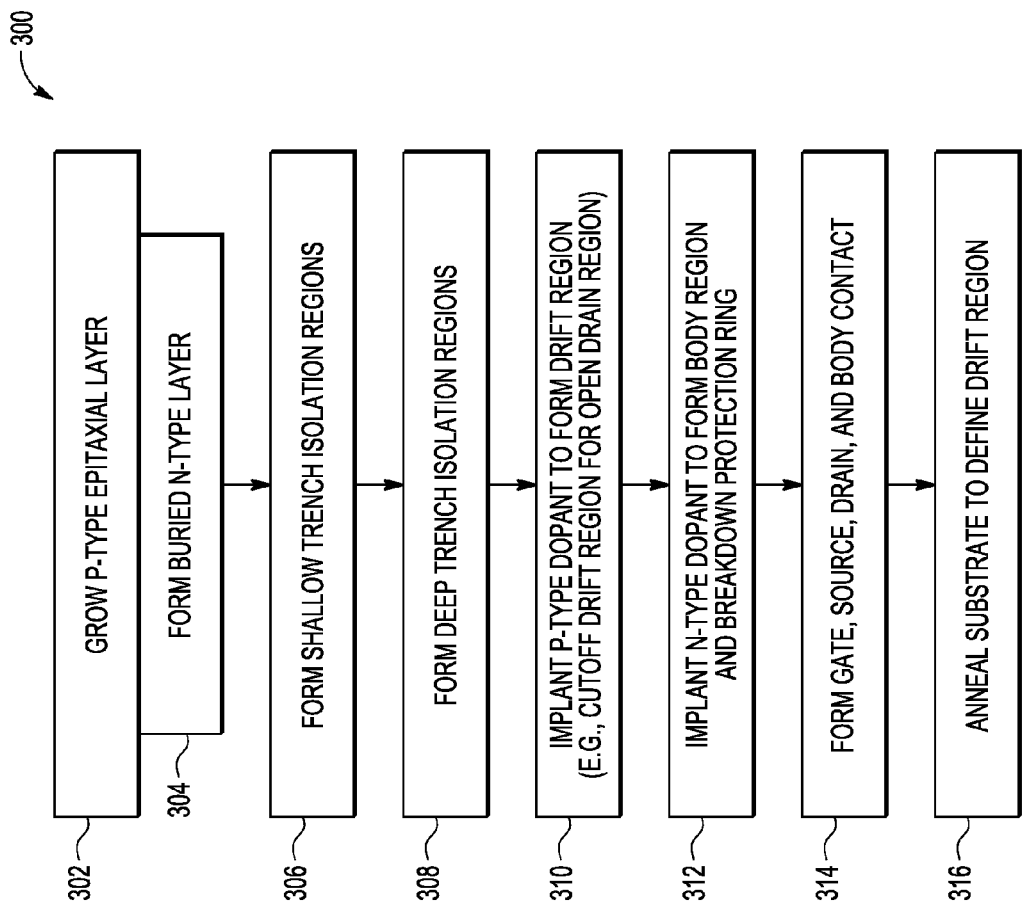
FIG. 3 is a flow diagram of an exemplary fabrication sequence to construct an LDMOS transistor peripheral breakdown protection in accordance with one embodiment.

FIG. 3 shows an exemplary fabrication method 300 for fabricating a semiconductor device with a breakdown protection region, such as the peripheral breakdown protection regions described above. The method may be directed to fabricating a reduced surface field (RESURF) transistor having one or more of the features described above. The transistor is fabricated with a semiconductor substrate, the regions or layers of which may have the conductivity types of the p-channel examples described above, or be alternatively configured to support a n-channel device. The method includes a sequence of acts, only the salient of which are depicted for convenience in illustration. The ordering of the acts may vary in other embodiments. The fabrication method is not limited to any particular doping mechanism, and may include future developed doping techniques.

The method may begin with, or include, act 302 in which a p-type epitaxial layer is grown on a lightly doped p-type semiconductor substrate. The substrate may be an SOI substrate. In this example, the act 302 includes act 304 in which one or more device isolation layers are formed before the growth of the epitaxial layer. The buried device isolation layer may be formed via, e.g., ion implantation, over the buried insulator layer of the SOI substrate. The buried device isolation layer may be configured via a mask to extend across an entire device area of the transistor. In some cases, the act 302 includes the growth of multiple p-type epitaxial layers. Any number of epitaxial layers may be grown.

In this embodiment, a number of isolation regions are formed at the surface of the substrate in act 306. The isolation regions may be STI regions. The STI regions may include, for instance, field isolation regions, which define the field drift length of the device. The isolation regions may be formed via any now known or hereafter developed procedure. For example, the act 306 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region(s) are formed after the drift region is formed.

In act 308, a number of device isolation regions are formed along a lateral periphery of the device. The device isolation regions may be DTI regions. In some cases, the act 308 includes the formation of a substrate tie disposed between a pair of DTI regions. The DTI regions may be configured as described above to reach the depth of the buried insulator layer of the SOI substrate. The order of the acts 306 and 308 may vary.

The substrate is doped in act 310 to form a well region in the epitaxial layer. In the embodiment of FIG. 3, p-type dopant is implanted to form a drift region of the device. The implantation procedure may be configured with a mask such that a well region is formed as shown in FIG. 1. The well region may thus have a lateral profile with an upright, vertical, or other cut-off on the drain side of the drift region to diminish the drift region at or under the drain region, as described above. For example, the well region may include an opening under the drain region, as described above. In some cases, the lateral extent of the well region does not overlap the location of the drain region. The drain side of the well region may also include a notched boundary along a lateral dimension orthogonal to the lateral dimension shown in the cross-section of FIG. 1. The notched boundary may be disposed along the opening in the well region.

The ion implantation procedure of act 310 may include one or more annealing or other diffusion procedures that distribute the implanted dopant ions toward a second or final profile or region for the drift region, as described herein. The resulting drift region may thus also include an opening under the drain region, including, in some cases, a notched boundary (e.g., in open-drain embodiments having an opening under the drain region) or notched dopant profile (e.g., in closed-drain embodiments without an opening under the drain region) as described herein.

In act 312, n-type dopant is implanted. In this embodiment, the implantation procedure is configured with a mask to form both a body region and the breakdown protection region of the device in the epitaxial layer of the substrate. The body region and the breakdown protection region may be configured as described above. In other embodiments, multiple implantation procedures may be used to form the body region and the breakdown protection region. A heavily doped n-type contact region for the body region may be formed in the n-type well of the body region via a separate ion implantation procedure.

The fabrication process may then include one or more procedures collectively shown in act 314. The procedures may be implemented in various orders. Additional or alternative procedures may be implemented. A gate structure may initially be formed. Source and drain regions may then be formed, using the gate structure for self-alignment of the source region. One or more p-type ion implantation procedures may be performed. For example, formation of one or both of the source region and the drain region may include a moderate implant before formation of sidewall spacers of the gate structure to create one or more transition regions (see, e.g., FIG. 1). A heavy implant after formation of the sidewall spacers may then be implemented to form the source and/or drain regions adjacent to such transition regions.

In some embodiments, the drain region is formed in a region that laterally overlaps with the well region initially formed in the act 310. The overlap may define a conduction path for the transistor. The overlap, however, does not extend laterally across the region in which the drain is formed, as described above and shown in FIG. 1. In other embodiments, the drain region does not overlap with the well region formed in the act 310. A conduction path between the drift region and the drain region is eventually established, however, via subsequent annealing of the substrate.

In the embodiment of FIG. 3, the substrate is annealed in act 316. The timing of the annealing may vary. For example, the substrate may be annealed after the act 310 and before the act 312. The manner in which the annealing procedure is implemented may also vary. The annealing procedure may result in redistributing the dopant ions for the drift region to form one or more current paths from the well region to the drain region. The drift region may thus be electrically coupled to the drain region. In some cases, the drift region extends laterally across the drain region, but in a diminished capacity as described above.

The implantation and annealing procedures may be configured such that the drift region under or along the drain region includes a first section in the conduction path and a second, thinner section outside of the conduction path. The first section may thus form a current pass or path, while the second section is configured to enhance the RESURF effect through easier depletion. The first section may have a higher dopant concentration level than the second section to maintain a suitably low resistance for the current pass.

Additional acts may be implemented at various points during the fabrication procedure. For example, a number of acts may be directed to depositing and defining one or more metal layers.

The above-described semiconductor devices and electronic apparatus provide breakdown protection with a region, such as a ring-shaped region, between a device isolation region boundary, such as a DTI wall, and a device body or other region through which current passes during operation. As described above, the region may be a lightly doped p-type ring (e.g., p-type epitaxial ring). The semiconductor device may have an SOI substrate, an open drain structure or other diminished drift region, and/or other features to improve the breakdown voltage level of a transistor device, such as a p-channel LDMOS transistor device. The breakdown protection region may allow such improvements to be achieved by preventing breakdown along the device area periphery. For example, the ring may reduce the E-field stress at a DTI corner, while also effectively lowering the pinning potential to reduce the E-field stress at drain. BVdss breakdown voltage levels of about 125 Volts or more may be achieved through, for instance, optimization of the width of the breakdown protection ring or region.

In a first aspect, a device includes a semiconductor substrate, source and drain regions disposed in the semiconductor substrate and having a first conductivity type, a body region disposed in the semiconductor substrate, having a second conductivity type, and in which the source region is disposed, a drift region disposed in the semiconductor substrate, having the first conductivity type, and through which charge carriers drift during operation upon application of a bias voltage between the source and drain regions, a device isolation region disposed in the semiconductor substrate and laterally surrounding the body region and the drift region, and a breakdown protection region disposed between the device isolation region and the body region and having the first conductivity type.

In a second aspect, an electronic apparatus includes a semiconductor substrate and a transistor disposed in the semiconductor substrate. The transistor includes first and second semiconductor regions having a first conductivity type, a third semiconductor region having a second conductivity type and through which current flows between the first and second semiconductor regions during operation, a device isolation region laterally surrounding the first, second, and third semiconductor regions, a breakdown protection region disposed between the device isolation region and the third semiconductor region and having the first conductivity type, and a buried layer extending laterally across the first semiconductor region, the second semiconductor region, and the third semiconductor region and having the second conductivity type.

In a third aspect, a method of fabricating a transistor in a semiconductor substrate includes forming a device isolation region in the semiconductor substrate, implanting dopant in a first region of the semiconductor substrate to form a drift region, forming source and drain regions in second and third regions of the semiconductor substrate, respectively, and implanting dopant to form a body region in which the source region is disposed and to form a breakdown protection region disposed between the device isolation region and the body region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate;
source and drain regions disposed in the semiconductor substrate and having a first conductivity type;
a body region disposed in the semiconductor substrate, having a second conductivity type, and in which the source region is disposed;
a drift region disposed in the semiconductor substrate, having the first conductivity type, and through which charge carriers drift during operation upon application of a bias voltage between the source and drain regions;
a device isolation region disposed in the semiconductor substrate and laterally surrounding the body region and the drift region; and
a breakdown protection region disposed between the device isolation region and the body region and having the first conductivity type;
wherein the breakdown protection region comprises an electrically floating well disposed between the device isolation region and the body region;
wherein the breakdown protection region has a width at a surface of the semiconductor substrate in a lateral direction that establishes a spacing between the body region and the device isolation region, the width falling in a range from 1.0 microns to 2.0 microns so that the breakdown protection region improves a breakdown voltage level of the device by preventing charge inversion from occurring in the body region along the device isolation region; and
wherein the first conductivity type is p-type and the second conductivity type is n-type.

2. The device of claim 1, wherein the breakdown protection region is ring-shaped and laterally surrounds the body region.

3. The device of claim 1, wherein the breakdown protection region is disposed along, and contiguous with, an inner boundary of the device isolation region.

4. The device of claim 1, wherein:
the semiconductor substrate comprises an epitaxial layer in which the body region and the drift region are disposed; and
the breakdown protection region is a portion of the epitaxial layer outside of dopant profiles of the body region and the drift region.

5. The device of claim 1, further comprising a buried layer disposed in the semiconductor substrate, extending laterally across the body region, the drift region, and the breakdown protection region, and having the second conductivity type.

6. The device of claim 5, further comprising a buried oxide layer disposed in the semiconductor substrate, over which the buried layer is disposed, and disposed at a depth to which the device isolation region reaches.

7. The device of claim 1, wherein the device isolation region comprises a deep trench isolation region.

8. The device of claim 1, wherein the device isolation region comprises:
a pair of deep trench isolation regions; and
a conductive region disposed between the pair of deep trench isolation regions and electrically connected to the semiconductor substrate and a ground terminal.

9. The device of claim 1, wherein the drift region does not extend laterally across an entire lateral extent of the drain region.

10. The device of claim 1, wherein:
the drift region comprises an outer section and an inner section surrounded by the outer section and disposed under the drain region; and
the inner section is diminished relative to the outer section such that full depletion of the drift region is attainable during operation.

11. An electronic apparatus comprising:
a semiconductor substrate; and
a transistor disposed in the semiconductor substrate and comprising:
first and second semiconductor regions having a first conductivity type;
a third semiconductor region having a second conductivity type and through which current flows between the first and second semiconductor regions during operation;
a device isolation region laterally surrounding the first, second, and third semiconductor regions;
a breakdown protection region disposed between the device isolation region and the third semiconductor region and having the first conductivity type; and
a buried layer extending laterally across the first semiconductor region, the second semiconductor region, and the third semiconductor region and having the second conductivity type;
wherein the breakdown protection region has a width at a surface of the semiconductor substrate in a lateral direction that establishes a spacing between the third semiconductor region and the device isolation region, the width falling in a range from 1.0 microns to 2.0 microns so that the breakdown protection region improves a breakdown voltage level of the transistor by preventing charge inversion from occurring in the third semiconductor region along the device isolation region;
wherein the breakdown protection region is electrically floating; and
wherein the first conductivity type is p-type and the second conductivity type is n-type.

12. The electronic apparatus of claim 11, wherein the breakdown protection region is disposed along, and contiguous with, an inner boundary of the device isolation region.

13. The electronic apparatus of claim 11, further comprising a buried oxide layer disposed in the semiconductor substrate, over which the buried layer is disposed, and disposed at a depth to which the device isolation region reaches, wherein the semiconductor substrate comprises an epitaxial layer over the buried oxide layer in which the first semiconductor region, the second semiconductor region, the third semiconductor region, and the breakdown protection region are disposed.

14. The electronic apparatus of claim 11, wherein the transistor is configured as a reduced surface field (RESURF) transistor.

15. The electronic apparatus of claim 11, wherein the breakdown protection region comprises a ring-shaped well disposed between the device isolation region and the third semiconductor region.

16. The electronic apparatus of claim 11, wherein the transistor further comprises a doped buried layer that extends laterally across the transistor to provide isolation along a lower boundary of the transistor, wherein the breakdown protection region has a lower boundary contiguous with the doped buried layer.

17. The device of claim 1, wherein the well is ring-shaped.

18. The device of claim 1, further comprising a doped buried layer that extends laterally across a device area to provide isolation along a lower boundary of the device, wherein the well has a lower boundary contiguous with the doped buried layer.

* * * * *